United States Patent
Shaashua et al.

(10) Patent No.: US 11,812,239 B2
(45) Date of Patent: Nov. 7, 2023

(54) DYNAMIC REDUCTION OF LOUDSPEAKER DISTORTION BASED ON PSYCHOACOUSTIC MASKING

(71) Applicant: WAVES AUDIO LTD., Tel Aviv (IL)

(72) Inventors: Meir Shaashua, Tel Aviv (IL); Itai Neoran, Beit-Hananya (IL); Matan Ben-Asher, Yahud (IL)

(73) Assignee: WAVES AUDIO LTD., Tel Aviv (IL)

( * ) Notice: Subject to any disclaimer, the term of this patent is extended or adjusted under 35 U.S.C. 154(b) by 200 days.

(21) Appl. No.: 17/608,110

(22) PCT Filed: Apr. 30, 2020

(86) PCT No.: PCT/IL2020/050487
§ 371 (c)(1),
(2) Date: Nov. 1, 2021

(87) PCT Pub. No.: WO2020/222242
PCT Pub. Date: Nov. 5, 2020

(65) Prior Publication Data
US 2022/0312114 A1    Sep. 29, 2022

Related U.S. Application Data

(60) Provisional application No. 62/840,490, filed on Apr. 30, 2019.

(51) Int. Cl.
*H04R 3/04* (2006.01)
*H04R 29/00* (2006.01)
(52) U.S. Cl.
CPC ............ *H04R 3/04* (2013.01); *H04R 29/001* (2013.01); *H04R 2430/01* (2013.01)

(58) Field of Classification Search
None
See application file for complete search history.

(56) References Cited

U.S. PATENT DOCUMENTS

| | | | |
|---|---|---|---|
| 2014/0341394 A1 | 11/2014 | Croft, III | |
| 2017/0061982 A1* | 3/2017 | Pakarinen | H03G 5/005 |
| 2017/0118569 A1 | 4/2017 | Quan | |

FOREIGN PATENT DOCUMENTS

| | | |
|---|---|---|
| EP | 2 632 141 A1 | 8/2013 |
| EP | 3 108 669 B1 | 4/2020 |
| JP | 2009244650 A * | 10/2009 |

OTHER PUBLICATIONS

Jul. 23, 2020 International Search Report issued in International Patent Application No. PCT/IL2020/050487.
Nov. 2, 2021 International Preliminary Report on Patentability issued in International Patent Application No. PCT/IL2020/050487.

* cited by examiner

*Primary Examiner* — James K Mooney
(74) *Attorney, Agent, or Firm* — Oliff PLC

(57) ABSTRACT

A processor-based method of reducing loudspeaker-induced harmonic distortion in sound generated by a loudspeaker responsive to a first audio signal, the method including: attenuating a first band in the first audio signal by an attenuation gain, the first band including a fundamental frequency, wherein the attenuating dynamically adjusts the attenuation gain in accordance with, at least, a ratio between: i) an energy of the first band in the first audio signal; and ii) an energy of a second band in the first audio signal, the second band including one or more frequencies that is an integer multiple of the fundamental frequency.

20 Claims, 5 Drawing Sheets

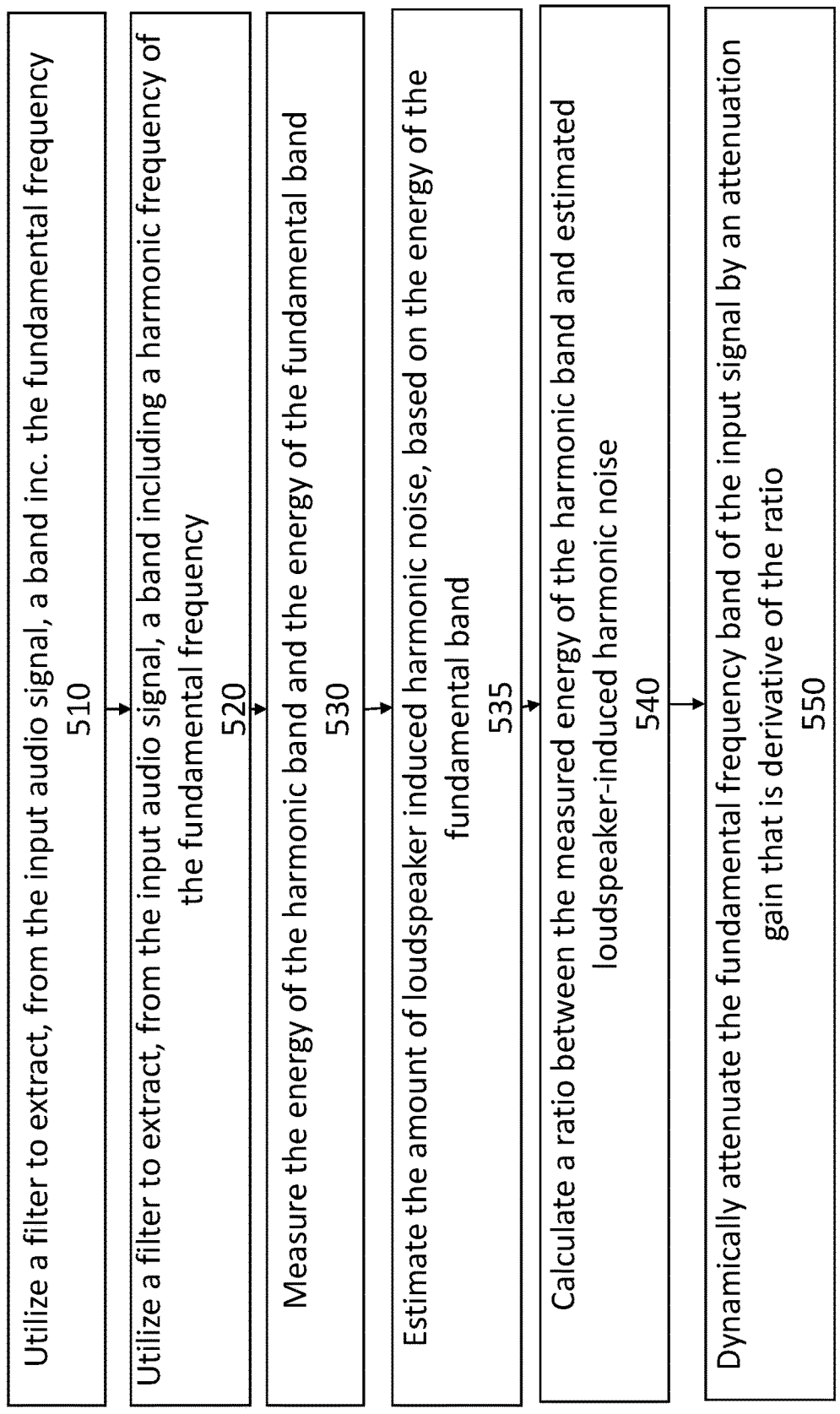

DYNAMIC REDUCTION OF LOUDSPEAKER DISTORTION BASED ON PSYCHOACOUSTIC MASKING

TECHNICAL FIELD

The presently disclosed subject matter relates to audio processing, and in particular to playback of audio on loudspeakers.

BACKGROUND

Loudspeakers sometimes present a significant amount of nonlinear behavior. In small speakers, this phenomenon can often be heard as "buzzing" artifacts when audio is rendered by the loudspeaker.

Problems of non-linear behavior in loudspeakers have been recognized in the conventional art and various techniques have been developed to provide solutions.

General Description

According to one aspect of the presently disclosed subject matter there is provided a system of reducing loudspeaker-induced harmonic distortion in sound generated by a loudspeaker responsive to a first audio signal, the system comprising a processing circuitry configured to:
   attenuate a first band in the first audio signal by an attenuation gain, the first band including a fundamental frequency,
   wherein the attenuating dynamically adjusts the attenuation gain in accordance with, at least, a ratio between:
      i) data derivative of energy of the first band in the first audio signal; and
      ii) energy of a second band in the first audio signal, the second band including one or more frequencies that is an integer multiple of the fundamental frequency.

In addition to the above features, the system according to this aspect of the presently disclosed subject matter can comprise one or more of features (i) to (vii) listed below, in any desired combination or permutation which is technically possible:
   (i) the processing circuitry is further configured to:
      b) repeat a) for one or more additional fundamental frequencies.
   (ii) the processing circuitry is further configured to outputting the adjusted audio signal to a loudspeaker.
   (iii) the second band includes the third harmonic frequency of the fundamental frequency.
   (iv) the attenuating comprises:
   extracting, from the first audio signal, a band including the fundamental frequency, thereby giving rise to a fundamental frequency band;
   extracting, from the first audio signal, a band that includes at least one frequency that is harmonic to the fundamental frequency, thereby giving rise to at least one harmonic frequency band;
   measuring energy of the fundamental frequency band and of the harmonic frequency band
   calculating an attenuation gain, the attenuation gain amount being derivative of a ratio between energy of the harmonic frequency band and energy of the fundamental frequency band; and
   attenuating the fundamental frequency by the attenuation gain.
   (v) the dynamic adjusting of the attenuation gain is in accordance with a ratio between i) the energy of the second band in the first audio signal, and ii) an estimated energy of loudspeaker-induced harmonic distortion of the fundamental frequency in the first audio signal,
      wherein the estimated energy of loudspeaker-induced harmonic distortion is derivative of energy of the first band in the first audio signal.
   (vi) the dynamic adjusting of the attenuation gain is in accordance with a power law of the ratio.
   (vii) the dynamic adjusting sets the attenuation gain to unity when the ratio between energy of the second band and energy of the first band is greater than a relative-energy threshold.

According to another aspect of the presently disclosed subject matter there is provided a computer implemented method of reducing loudspeaker-induced harmonic distortion in sound generated by a loudspeaker responsive to a first audio signal, the method comprising:
   a) attenuating a first band in the first audio signal by an attenuation gain, the first band including a fundamental frequency,
   wherein the attenuating dynamically adjusts the attenuation gain in accordance with, at least, a ratio between:
      i) data derivative of an energy of the first band in the first audio signal; and
      ii) an energy of a second band in the first audio signal, the second band including one or more frequencies that is an integer multiple of the fundamental frequency.

This aspect of the disclosed subject matter can optionally comprise one or more of features (i) to (x) listed above with respect to the system, mutatis mutandis, in any desired combination or permutation which is technically possible.

According to another aspect of the presently disclosed subject matter there is provided a non-transitory program storage device readable by a computer, tangibly embodying computer readable instructions executable by the computer to perform a method of reducing loudspeaker-induced harmonic distortion in sound generated by a loudspeaker responsive to a first audio signal, the method comprising:
   a) attenuating a first band in the first audio signal by an attenuation gain, the first band including a fundamental frequency,
   wherein the attenuating dynamically adjusts the attenuation gain in accordance with, at least, a ratio between:
      i) data derivative of an energy of the first band in the first audio signal; and
      ii) an energy of a second band in the first audio signal, the second band including one or more frequencies that is an integer multiple of the fundamental frequency.

This aspect of the disclosed subject matter can optionally comprise one or more of features (i) to (vii) listed above with respect to the system, mutatis mutandis, in any desired combination or permutation which is technically possible.

According to one aspect of the presently disclosed subject matter there is provided a system of reducing loudspeaker-induced harmonic distortion in sound generated by a loudspeaker responsive to a first audio signal, the system comprising a processing circuitry configured to:
   attenuate a first band in the first audio signal by an attenuation gain, the first band including a fundamental frequency,
   wherein the attenuating dynamically adjusts the attenuation gain in accordance with, at least:
      i) energy of the first band in the first audio signal; and ii) energy of a second band in the first audio signal, the second band including one or more frequencies that is an integer multiple of the fundamental frequency;

thereby giving rise to an adjusted audio signal wherein energy of the first band is reduced responsive to audio frequency content generative of psychoacoustic masking of loudspeaker-induced harmonic distortion.

In addition to the above features, the system according to this aspect of the presently disclosed subject matter can comprise one or more of features (i) to (x) listed below, in any desired combination or permutation which is technically possible:

(i) the processing circuitry is further configured to:
b) repeat a) for one or more additional fundamental frequencies.
(ii) the processing circuitry is further configured to outputting the adjusted audio signal to a loudspeaker.
(iii) the second band includes the third harmonic frequency of the fundamental frequency.
(iv) the attenuating sets the attenuation gain to a value that is not less than a difference between the energy of the first band and a fundamental frequency upper energy threshold,
wherein the fundamental frequency upper energy threshold is less than the energy of the second band.
(v) wherein the attenuating comprises:
extracting, from the first audio signal, a band including the fundamental frequency, thereby giving rise to a fundamental frequency band;
extracting, from the first audio signal, a band that includes at least one frequency that is harmonic to the fundamental frequency, thereby giving rise to at least one harmonic frequency band;
measuring energy of the fundamental frequency band and of the harmonic frequency band
calculating an attenuation gain, the attenuation gain amount being derivative of energy of the harmonic frequency band and energy of the fundamental frequency band; and
attenuating the fundamental frequency by the attenuation gain.
(vi) the dynamic adjusting of the attenuation gain is in accordance with, at least, a ratio between i) the energy of the second band in the first audio signal, and ii) the energy of the first band in the first audio signal.
(vii) the dynamic adjusting of the attenuation gain is in accordance with a ratio between i) the energy of the second band in the first audio signal, and ii) an estimated energy of loudspeaker-induced harmonic distortion of the fundamental frequency in the first audio signal,
wherein the estimated energy of loudspeaker-induced harmonic distortion is derivative of energy of the first band in the first audio signal.
(viii) the fundamental frequency upper energy threshold equals the energy of the second band multiplied by a fundamental frequency upper energy threshold ratio,
wherein the fundamental frequency upper energy threshold ratio is between 0 and 1.
(ix) the dynamic adjusting of the attenuation gain is in accordance with a power law of the ratio.
(x) the dynamic adjusting sets the attenuation gain to unity when the ratio between energy of the second band and energy of the first band is greater than a relative-energy threshold.

According to another aspect of the presently disclosed subject matter there is provided a computer implemented method of reducing loudspeaker-induced harmonic distortion in sound generated by a loudspeaker responsive to a first audio signal, the method comprising:

a) attenuating a first band in the first audio signal by an attenuation gain, the first band including a fundamental frequency,
wherein the attenuating dynamically adjusts the attenuation gain in accordance with, at least:
i) an energy of the first band in the first audio signal; and
ii) an energy of a second band in the first audio signal, the second band including one or more frequencies that is an integer multiple of the fundamental frequency;
thereby giving rise to an adjusted audio signal wherein energy of the first band is reduced responsive to audio frequency content that is predictive of psychoacoustic masking of loudspeaker-induced harmonic distortion.

This aspect of the disclosed subject matter can optionally comprise one or more of features (i) to (x) listed above with respect to the system, mutatis mutandis, in any desired combination or permutation which is technically possible.

According to another aspect of the presently disclosed subject matter there is provided a non-transitory program storage device readable by a computer, tangibly embodying computer readable instructions executable by the computer to perform a method of reducing loudspeaker-induced harmonic distortion in sound generated by a loudspeaker responsive to a first audio signal, the method comprising:

a) attenuating a first band in the first audio signal by an attenuation gain, the first band including a fundamental frequency,
wherein the attenuating dynamically adjusts the attenuation gain in accordance with, at least:
i) an energy of the first band in the first audio signal; and
ii) an energy of a second band in the first audio signal, the second band including one or more frequencies that is an integer multiple of the fundamental frequency;
thereby giving rise to an adjusted audio signal wherein energy of the first band is reduced responsive to audio frequency content that is predictive of psychoacoustic masking of loudspeaker-induced harmonic distortion.

This aspect of the disclosed subject matter can optionally comprise one or more of features (i) to (x) listed above with respect to the system, mutatis mutandis, in any desired combination or permutation which is technically possible.

Among advantages of certain embodiments of the presently disclosed subject matter are reduced non-linear behavior by loudspeakers and improvement of listener experience.

BRIEF DESCRIPTION OF THE DRAWINGS

In order to understand the invention and to see how it can be carried out in practice, embodiments will be described, by way of non-limiting examples, with reference to the accompanying drawings, in which:

FIG. 5 illustrates a flow diagram of an alternative example processor-based method of adjusting an input audio signal to result in reduced loudspeaker-induced harmonic distortion of a fundamental frequency, according to some embodiments of the presently disclosed subject matter;

DETAILED DESCRIPTION

In the following detailed description, numerous specific details are set forth in order to provide a thorough understanding of the invention. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "processing", "computing", "comparing", "measuring", "adjusting", "determining", "calculating", "receiving", "mitigating", "reducing", "filtering", "extracting", "attenuating" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the processor, mitigation unit, and inspection unit therein disclosed in the present application.

The terms "non-transitory memory" and "non-transitory storage medium" used herein should be expansively construed to cover any volatile or non-volatile computer memory suitable to the presently disclosed subject matter.

The operations in accordance with the teachings herein may be performed by a computer specially constructed for the desired purposes or by a general-purpose computer specially configured for the desired purpose by a computer program stored in a non-transitory computer-readable storage medium.

Embodiments of the presently disclosed subject matter are not described with reference to any particular programming language. It will be appreciated that a variety of programming languages may be used to implement the teachings of the presently disclosed subject matter as described herein.

Figure 1:
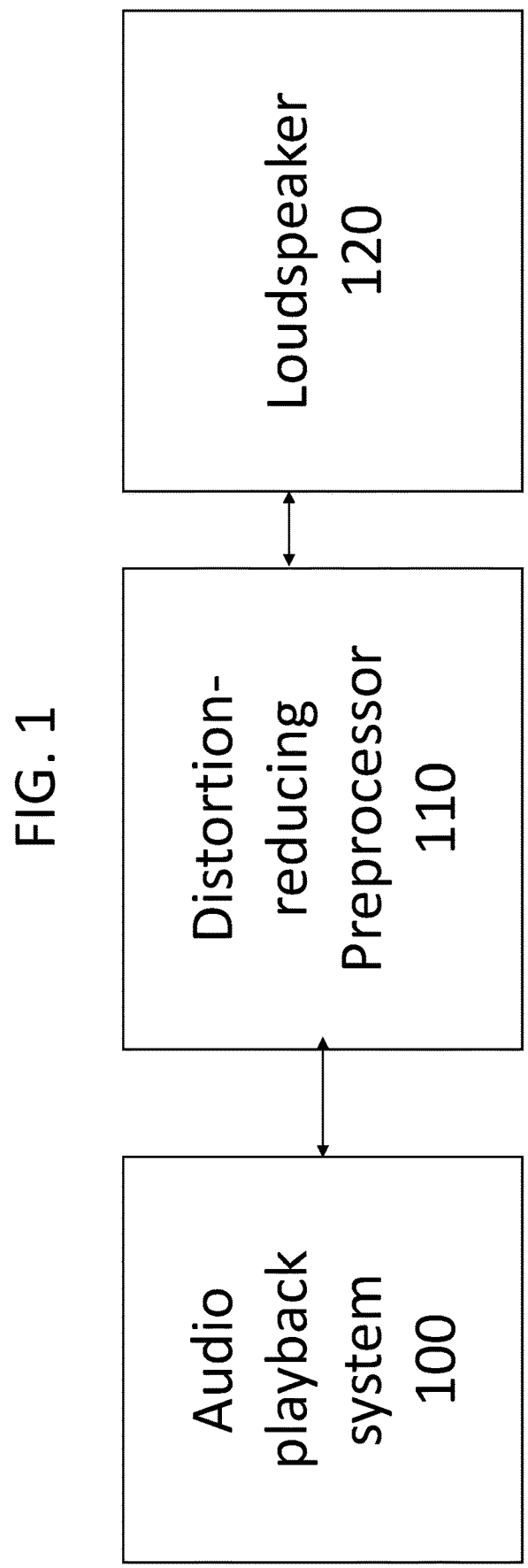
FIG. 1 illustrates a block diagram of an example audio playback system employing preprocessing so as to reduce harmonic non-linear behavior, according to some embodiments of the presently disclosed subject matter.

Bearing this in mind, attention is now directed to FIG. 1, which illustrates an example audio playback system employing preprocessing to reduce harmonic non-linear behavior, according to some embodiments of the presently disclosed subject matter.

Some loudspeaker designs exhibit a significant amount of nonlinear behavior. Such nonlinear behavior can be observed by playing a sine tone through a speaker and measuring the level of harmonics relative to the fundamental in the frequency domain (the harmonics are integer multiples of the fundamental frequency, and some harmonics are generated by the loudspeakers themselves). For example, with mini loudspeakers, the non-linear behavior can often be heard as "buzzing" artifacts at certain harmonic frequencies where the speakers resonate more strongly than at other frequencies.

Some embodiments of the presently disclosed subject matter prevent or reduce loudspeaker-induced buzzing/non-linear phenomena in audio playback by performing preprocessing that attenuates certain frequency bands of the audio signal—for example by applying dynamic range compression.

However, reducing band energy can degrade audio quality.

Buzzing/non-linear behavior is most prominent on certain kinds of input signals (for example instruments like piano) and these phenomena are largely imperceivable on other signals (such as wide-band pop music). The reason is that when high frequencies exist in the input signal, they mask the harmonic distortion created by the loudspeaker in the ranges of those frequencies (i.e. render the speaker-generated harmonics inaudible or less audible). In such cases, the buzzing or non-linear phenomena can be absent or not perceived.

Some embodiments of the presently disclosed subject matter—accordingly—dynamically vary the amount of pre-processing attenuation as the frequency content of the input signal (and thus the extent of masking of harmonic distortion) changes. In this manner, the preprocessing applies only a necessary amount of attenuation to each input signal band—attenuating only to the extent necessary for alleviating perceivable loudspeaker-induced harmonic distortion while minimizing degradation to audio quality in other aspects.

Specifically: when there is more energy in the bands of the input signal containing harmonic frequencies, the preprocessing attenuates the fundamental frequency to a lesser extent thus avoiding excessive attenuation when it is not needed and preserving the audio quality. Conversely, when there is less energy in the bands of the input signal containing harmonic frequencies, the preprocessing applies a greater amount of attenuation to the fundamental frequency in order to prevent perceivable loudspeaker-induced harmonic distortion.

In some embodiments, the preprocessing can be implemented as a circuit that receives an input audio signal and outputs a modified audio signal. In such embodiments, the input and output audio signals can be either digital or analog.

In some embodiments, the preprocessing can be implemented as a processor-based method which operates on digital audio data.

FIG. 1 illustrates audio playback system 100, which can be any kind of digital or analog audio playback system (digital music player, radio, phone etc.). Audio playback system 100 can be operably connected to distortion-reducing preprocessor 110 (for example via an analog or digital audio connection, as appropriate), so that an audio signal from audio playback system 100 can be output to distortion-reducing preprocessor 110. Distortion-reducing preprocessor 110 can process input audio from audio playback system 100. Distortion-reducing preprocessor 110 can also be operably connected to loudspeaker 120, and can output a pre-processed audio signal to loudspeaker 120. Loudspeaker 120 can be any type of audio output device, including but not limited to minispeakers, headphones etc.

In some embodiments, distortion-reducing preprocessor 110 can be physically contained within audio playback system 100, so that an audio signal from audio playback system 100 is output directly to loudspeaker 120. In some embodiments, distortion-reducing preprocessor 110 can be physically contained within loudspeaker 120.

In some embodiments, a series of distortion-reducing preprocessors 110 can be sequentially employed between audio playback device 100 and loudspeaker 120, with each instance of distortion-reducing preprocessor 110—for example—reducing the harmonic distortion associated with (e.g. derivative of) a particular fundamental frequency. In some embodiments, such a series of distortion-reducing preprocessor 110 can be, for example, physically located in a single unit, or included in audio playback device 100 or loudspeaker 120, or divided among them etc.

It is noted that the teachings of the presently disclosed subject matter are not bound by the audio playback system described with reference to FIG. 1. Equivalent and/or modified functionality can be consolidated or divided in another manner and can be implemented in any appropriate combination of software with firmware and/or hardware and executed on a suitable device. The audio playback system can be a standalone network entity, or integrated, fully or partly, with other entities. It will be clear to one skilled in the art how an audio playback system can be employed in embodiments such as personal computers, mobile devices etc.

Figure 2:
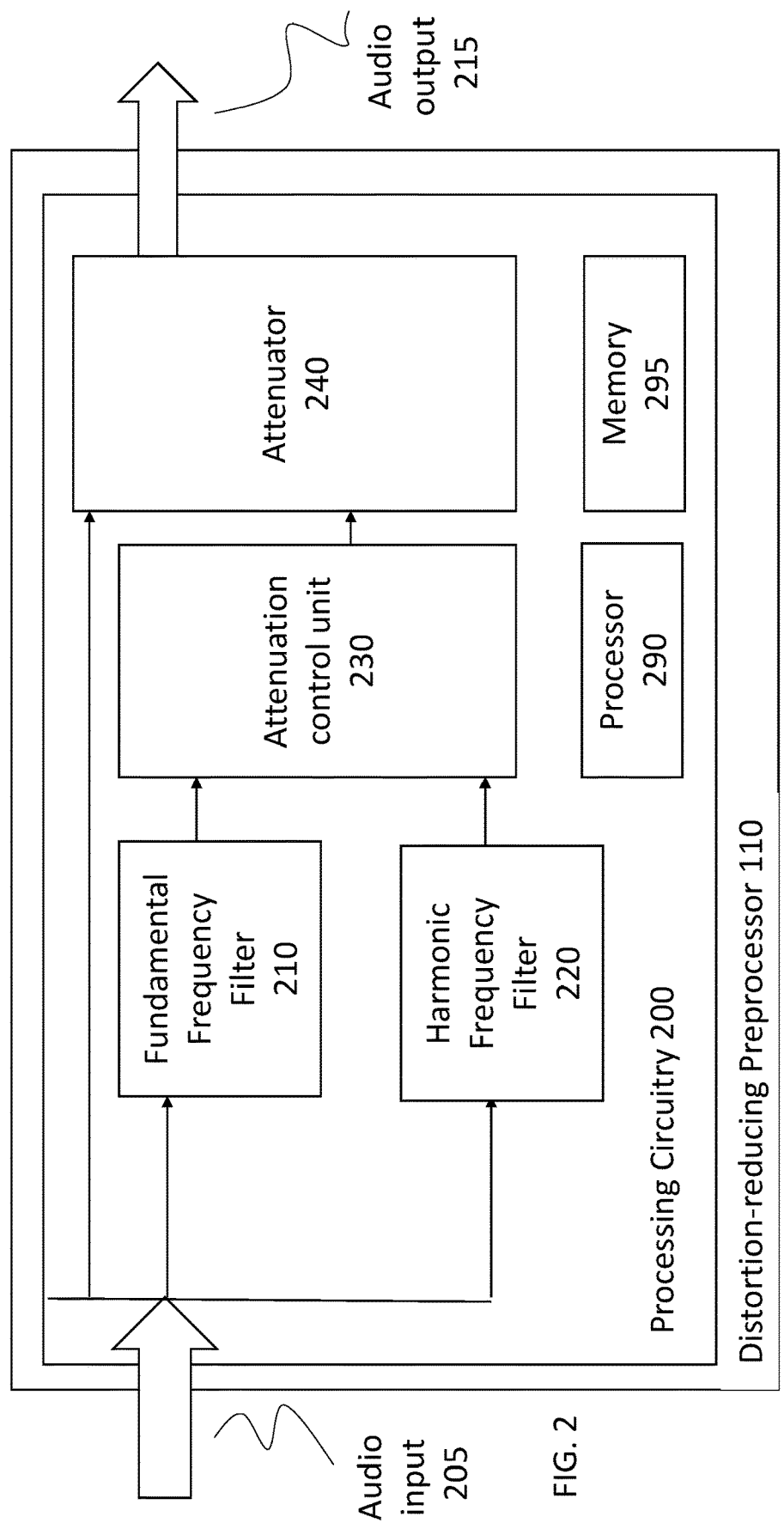
FIG. 2 illustrates a block diagram of an example a block diagram of an example implementation of distortion-reducing preprocessor, according to some embodiments of the presently disclosed subject matter.

Attention is now directed to FIG. 2, which illustrates a block diagram of an example implementation of distortion-reducing preprocessor 110, according to some embodiments of the presently disclosed subject matter.

In some embodiments, distortion-reducing preprocessor 110 is implemented as part of a processor-based platform (for example: mobile phone, personal computer, digital audio workstation (DAW) with plugin modules etc.) based on a processing circuitry 200 including a processor 290 and memory 295.

Processor 290 can be a suitable hardware-based electronic device with data processing capabilities, such as, for example, a general purpose processor, digital signal processor (DSP), a specialized Application Specific Integrated Circuit (ASIC), one or more cores in a multicore processor etc. Processor 290 can also consist, for example, of multiple processors, multiple ASICs, virtual processors, combinations thereof etc.

A memory 295 can be, for example, a suitable kind of volatile or non-volatile storage, and can include, for example, a single physical memory component or a plurality of physical memory components. Memory 295 can also include virtual memory. Memory 295 can be configured to, for example, store various data used in computation.

As will be further detailed hereinbelow with reference to FIGS. 3-5, processor 290 can be configured to execute several functional modules in accordance with computer-readable instructions implemented on a non-transitory computer-readable storage medium. Such functional modules are referred to hereinafter as comprised in the processor. These modules can include, for example, fundamental frequency filter 210, harmonic frequency filter 220, attenuation control unit 230, and attenuator 240.

Input audio signal 205 can be, for example, a digital or analog audio input signal. Input audio signal 205 can originate at, for example, audio playback device 100.

Input audio signal 205 can be processed by fundamental frequency filter 210. Fundamental frequency filter 210 can be any kind of appropriate filter. Fundamental frequency filter 210 can be configured to output a band of the input audio signal including a particular fundamental frequency. In some embodiments, fundamental frequency filter 210 can be, for example, a bandpass filter. In some embodiments, fundamental frequency filter 210 can be, for example, a lowpass filter—so that the filter outputs a band including the fundamental frequency as well as frequencies below it.

Input audio signal 205 can be processed by harmonic frequency filter 220. The processing is in parallel to processing by fundamental frequency filter 210. Harmonic frequency filter 220 can be any kind of appropriate filter. Harmonic frequency filter 220 can be configured to output a band of the audio input signal including one or more harmonic frequencies (i.e. an integer multiple) of the fundamental frequency of fundamental frequency filter 210 (for example: the second harmonic or third harmonic of the fundamental frequency). In some embodiments, harmonic frequency filter 220 can be, for example, a bandpass filter. In some embodiments, harmonic frequency filter 220 can be, for example, a high-pass filter—so that the filter outputs a band including the harmonic frequency as well as frequencies above it.

In some embodiments, can be configured to output the third harmonic frequency of the fundamental frequency.

Attenuation control unit 230 can be operably connected to fundamental frequency filter 210 and harmonic frequency bandpass 220 (and any additional harmonic frequency filters), and can receive the audio signals that are output by these filters. Attenuation control unit 230 can determine the amount of attenuation gain that should be applied to the fundamental frequency so as to reduce loudspeaker-induced harmonic distortion while maintaining the quality of audio playback. Attenuation control unit 230 can determine the amount of attenuation gain using, for example, methods described hereinbelow with reference to FIGS. 3-5. The amount of attenuation gain determined by attenuation control unit 230 can vary dynamically in accordance with the audio signal inputs from fundamental frequency filter 210 and harmonic frequency filter 220.

Attenuation control unit 230 can output data or a signal indicative of the amount of attenuation gain that that the attenuator should apply.

Input audio signal 205 can be processed by attenuator 240. The processing is in parallel to the processing by fundamental frequency filter 210 and harmonic frequency filter 220. Attenuator 240 can also receive a signal indicative of an attenuation amount (for example in decibels (dB)) from attenuation control unit 230. Attenuator 240 can generate audio output 215 in which the fundamental frequency (i.e. the fundamental frequency associated with fundamental frequency bandpass filter 210) of input audio signal 205 has been attenuated in accordance with the attenuation amount indicated by attenuation control unit 230. Attenuator 240 can be any appropriate type of audio frequency attenuation mechanism as known in the art (e.g. multiband compressor, dynamic equalizer etc.).

The amount of attenuation performed by attenuator 240 can vary dynamically in accordance with the attenuation gain input from attenuation control unit 230. In this manner, the fundamental frequency can be attenuated only when the harmonic frequencies of input audio signal 205 lack the energy necessary to mask loudspeaker-induced harmonic distortion. Similarly, the amount of attenuation of the fundamental frequency can be limited to the amount required to mask the loudspeaker-induced distortion.

It is noted that while the preceding description addresses an embodiment in which distortion-reducing preprocessor 110 is implemented by a processor 290 and memory 295, other implementations are possible as would be evident to one skilled in the art. For example, the functions of processing circuitry 200 can implemented using hardware components, analog signals/circuits etc. as evident to one skilled in the art.

It is noted that the teachings of the presently disclosed subject matter are not bound by the distortion-reducing preprocessor described with reference to FIG. 1. Equivalent and/or modified functionality can be consolidated or divided in another manner and can be implemented in any appropriate combination of software with firmware and/or hardware and executed on a suitable device. The distortion-reducing preprocessor can be a standalone network entity, or integrated, fully or partly, with other entities. It will be clear to one skilled in the art how a distortion-reducing preprocessor can be employed in embodiments such as personal computers, mobile devices etc.

Figure 3:
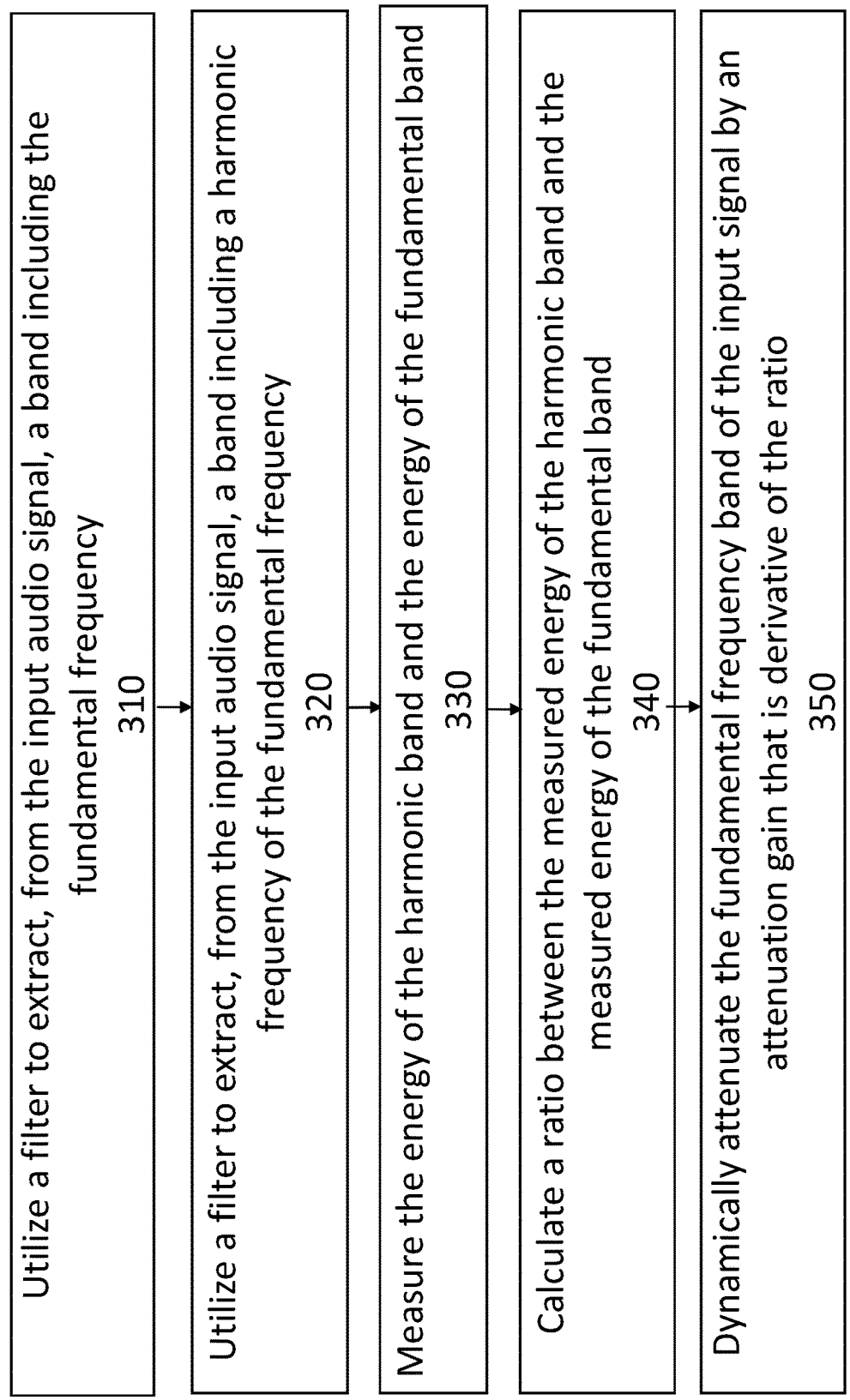
FIG. 3 illustrates a flow diagram of an example processor-based method of adjusting an input audio signal to result in reduced loudspeaker-induced harmonic distortion of a fundamental frequency, according to some embodiments of the presently disclosed subject matter.

Attention is now directed to FIG. 3, which illustrates a flow diagram of an example processor-based method of adjusting an input audio signal to result in reduced loudspeaker-induced harmonic distortion of a fundamental frequency, in accordance with some embodiments of the presently disclosed subject matter.

In some embodiments, preprocessor 110 can preprocess audio to be output on a loudspeaker which has certain resonant frequencies for which the loudspeaker can generate non-linear effects/buzzing.

By way of non-limiting example, a particular type of loudspeaker might generate a buzzing sound according to the magnitude of the audio signal of a band centered on the resonant frequency of 200 Hz. For the fundamental frequency of 200 Hz, the "second harmonic" frequency is at 400 Hz, the "third" is at 600 Hz etc.

Preprocessor 110 (for example, fundamental frequency filter 210), can extract (310) a band (hereforward termed "fundamental frequency band") including a fundamental frequency (e.g. 180 Hz-220 Hz, which includes fundamental frequency 200 Hz). In some embodiments, fundamental frequency filter 210 can be band-pass filter. In some embodiments, fundamental frequency filter 210 can be a lowpass filter, so that all frequencies above a certain lower limit (e.g. 300 Hz, so that the band includes fundamental frequency 200 Hz) are part of the fundamental frequency band.

Preprocessor 110 (for example, harmonic frequency filter 220), can extract (320) a band (hereforward termed "harmonic frequency band") including one or more harmonics of the fundamental frequency (e.g. 580 Hz-620 Hz, which includes $3^{rd}$ harmonic frequency 600 Hz). In some embodiments, harmonic frequency filter 220 can be band-pass filter. In some embodiments, harmonic frequency filter 220 can be a highpass filter, so that all frequencies above a certain lower limit (e.g. 500 Hz, so that the band includes $3^{rd}$ harmonic frequency 600 Hz) are part of the harmonic frequency band.

In some embodiments, the harmonic frequency band includes multiple harmonic frequencies. In some embodiments, the harmonic frequency band can overlap with the fundamental frequency band. In some embodiments, the harmonic frequency band can be a grouping of sub-bands, where one or more of the sub-bands includes a frequency that is a harmonic to the fundamental frequency.

Preprocessor 110 (for e.g. attenuation control unit 230), can next measure (330) the energy of the fundamental frequency band and the energy of the harmonic frequency band (for example: in dB).

Preprocessor 110 (for e.g. attenuation control unit 230), can then derive an attenuation gain from: i) the measured energy of the fundamental frequency band and ii) the measured energy of the harmonic frequency band. In some embodiments, preprocessor 110 (for e.g. attenuation control unit 230), calculates (340) a ratio between the energy of the fundamental frequency band and the energy of the harmonic frequency band. In some embodiments, preprocessor 110 (for e.g. attenuation control unit 230), calculates (340) a ratio between data derivative of the energy of the fundamental frequency band and the energy of the harmonic frequency band.

By way of non-limiting example, preprocessor 110 (for e.g. attenuation control unit 230), might measure the energy of the fundamental frequency band and determine an energy of 0 dB, and might measure the energy of the harmonic frequency band and determine an energy of 6 dB. The preprocessor can then calculate the ratio of the energies: 6 db (i.e. 2).

Preprocessor 110 (e.g. attenuator 240) can then dynamically attenuate (350) the fundamental frequency band of the input signal. Preprocessor 110 (e.g. attenuation control unit 230) can dynamically vary the attenuation gain in response to changes of the calculated ratio.

In some embodiments, the attenuation gain is computed using the following formula:

$$\text{AttenuationAdjustmentFactor} = \text{alpha}^{ratio}$$

where alpha is a number between 0 and 1. In this formula, the ratio parameter is the ratio of the band energies, for example as calculated above. A formula such as this one—i.e. where an adjustment factor is calculated according to a constant to the power of the calculated ratio of band energies—is hereforward termed a power law.

Attenuation gain can be then derived from the attenuation adjustment factor by means known in the art. For example:

$$\text{AttenuationGain} = \text{FundamentalBandUpperEnergyThreshold}/(\text{AttenuationAdjustmentFactor} * \text{EnergyOfFundamentalBand})$$

A smaller adjustment factor dictates a lesser attenuation (i.e. a higher attenuation gain).

If the energy in the harmonic band is sufficiently high in comparison to the energy in the fundamental band, loudspeaker-induced harmonic distortion will not be audible (as described above)—so attenuation of the fundamental band is not required. Accordingly, in some embodiments, preprocessor 110 (e.g. attenuation control unit 230) attenuates using an attenuation gain of unity (i.e. 0 dB) when the ratio between energy of the band including one or more harmonics of the fundamental frequency and the energy of the band including the fundamental frequency is greater than, for example, a statically-configured or dynamically-computed relative-energy threshold.

In some embodiments, preprocessor 110 (e.g. attenuation control unit 230) can determine attenuation gain from the ratio of band energies according to a different suitable method. In some embodiments, preprocessor 110 (e.g. attenuation control unit 230) can determine attenuation gain from the measured band energies according to a different suitable method.

It is noted that the teachings of the presently disclosed subject matter are not bound by the flow chart illustrated in FIG. 3, the illustrated operations can occur out of the illustrated order. For example, operations 310 and 320, shown in succession, can be executed substantially concurrently, or in the reverse order. It is also noted that whilst the flow chart is described with reference to elements of the system of FIG. 1 or 2, this is by no means binding, and the operations can be performed by elements other than those described herein.

Figure 4:
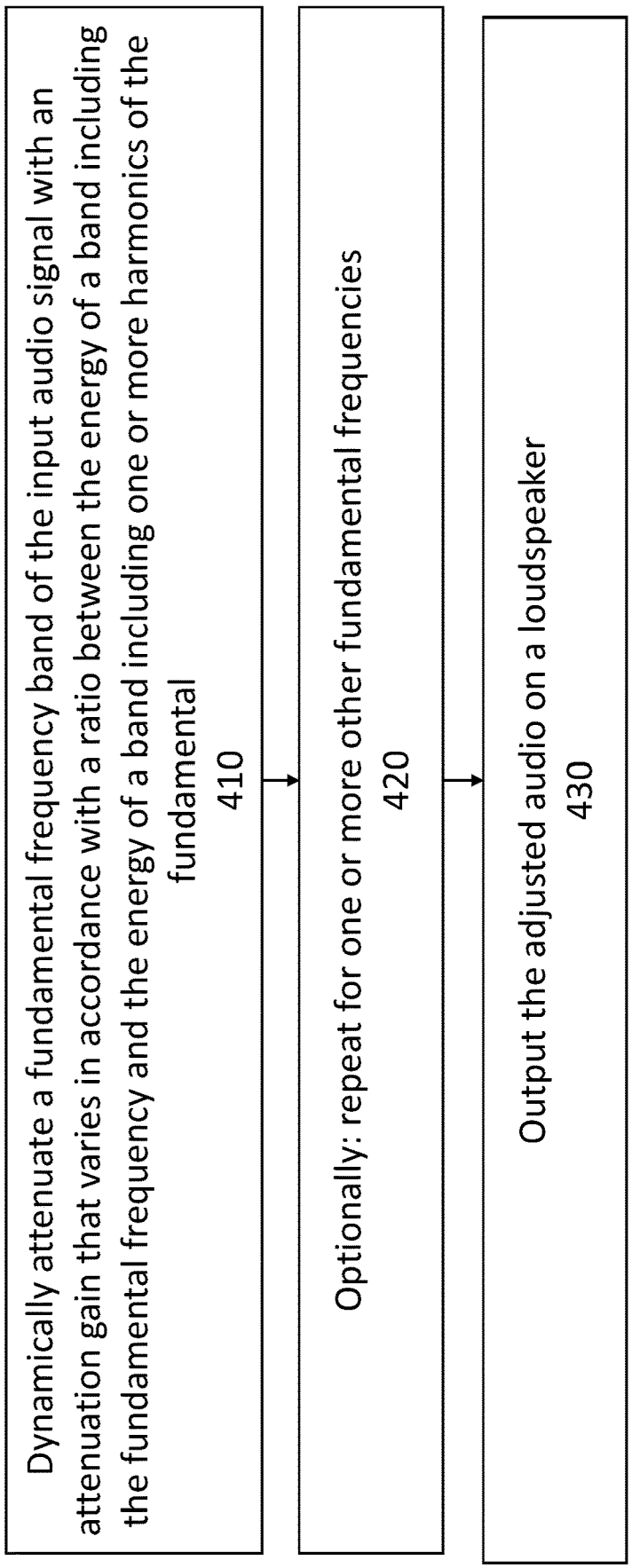
FIG. 4 illustrates a flow diagram of an example processor-based method of reducing loudspeaker-induced harmonic distortion of an audio signal, according to some embodiments of the presently disclosed subject matter.

Attention is now directed to FIG. 4, which illustrates a flow diagram of an example processor-based method of reducing loudspeaker-induced harmonic distortion of an audio signal, in accordance with some embodiments of the presently disclosed subject matter.

In some embodiments, preprocessor 110 can preprocess audio for output on a loudspeaker on which audio at specific fundamental frequencies can generate non-linear effects or buzzing.

By way of non-limiting example: a particular loudspeaker might generate a buzzing sound responsive to the content of the input audio signal at fundamental frequencies 200 Hz and 500 Hz. For the fundamental frequency of 200 Hz, the "second harmonic" frequency is at 400 Hz, the "third" is at 600 Hz etc. For the fundamental frequency of 500 Hz, the "second harmonic" frequency is at 1000 Hz, the "third" is at 1500 Hz etc.

As described hereinabove, an audio signal which lacks content in bands containing frequencies that are harmonic to the fundamental frequency (as may be the case with e.g. solo piano music) can cause such loudspeakers to generate buzzing or non-linear effects. Whereas in the case of music that has content in these harmonic bands (as may be the case with e.g. piano music including drums or other instruments), the audio content of these bands can result in psychoacoustic elimination of loudspeaker-induced harmonic distortion i.e. render such distortion inaudible to the listener.

The distortion-reducing preprocessor 110 (e.g. attenuator 240) can dynamically attenuate (410) a band containing a fundamental frequency of the input audio signal 205 with an attenuation gain which preprocessor 110 (e.g. attenuator 240) dynamically varies in accordance with: i) the energy of the band including the fundamental frequency and ii) the energy of a band including one or more harmonics of the fundamental. In some embodiments, the dynamic attenuation results in an adjusted audio signal in which energy of the band including the fundamental frequency is reduced in response to (and/or in proportion to) absence of audio frequency content that generates psychoacoustic masking of loudspeaker-induced harmonic distortion.

In some embodiments, preprocessor 110 (e.g. attenuation control unit 230) dynamically determines the attenuation gain, for example, using one of the methods described above with reference to FIG. 3 or described below with reference to FIG. 5.

By way of non-limiting example: preprocessor 110 (e.g. attenuator 240) can dynamically attenuate band 180 Hz-220 Hz (which contains fundamental frequency 100 Hz), with an attenuation gain resulting from a power law of the ratio between energy in the band 500 Hz and above (including third harmonic frequency 600 Hz) the energy in the band 180 Hz-220 Hz.

In some embodiments, preprocessor 110 (e.g. attenuation control unit 230) dynamically determines the attenuation gain using other methods which derive attenuation gain from i) the energy of the band including the fundamental frequency and ii) the energy of a band including one or more harmonics of the fundamental.

In some embodiments, preprocessor 110 (e.g. attenuation control unit 230) dynamically determines the attenuation gain using a method which ensures that the energy of the fundamental band in output signal 215 is below a threshold (hereforward termed a fundamental frequency upper energy threshold). Specifically: preprocessor 110 (e.g. attenuation control unit 230) can set the attenuation gain to a value that is greater than or equal to the difference between energy of the first band and the fundamental frequency upper energy. In some such embodiments, the fundamental frequency upper energy threshold is some value that is less than the energy of the harmonic band. In some such embodiments, the fundamental frequency upper energy threshold can be the dynamically varying energy of the harmonic band multiplied by some value (herein termed the fundamental frequency upper energy threshold ratio) which is between 0 and 1. In some such embodiments, preprocessor 110 (e.g. attenuation control unit 230) ensures that any loudspeaker-induced harmonic distortion will be masked by the content of the harmonic band.

Optionally, preprocessor 110 (e.g. attenuator 240) can dynamically attenuate (420) bands including additional fundamental frequencies of the input audio signal in the same manner (i.e. in accordance with energy of the fundamental band and energy of respective harmonic bands).

By way of non-limiting example: preprocessor 110 (e.g. attenuator 240) can dynamically attenuate band 400 Hz-600 Hz (which contains a second fundamental frequency 500 Hz), based on a power law of the ratio between energy in the band 1200 Hz-1800 Hz (including third harmonic frequency 1500 Hz) the energy in the band 400 Hz-600 Hz.

This can be accomplished, for example, by processing the audio output 215 with an additional instance of distortion-reducing preprocessor 110. Alternatively, this can be accomplished, for example, by processing the audio output 215 with an additional series of filters and an additional attenuator. Alternatively, this can be accomplished by a modified architecture of preprocessor 100, where in multiple instances of filters and attenuation control units provide attenuation gain values for different fundamental bands—so that attenuator 240 can attenuate multiple fundamental bands. In some embodiments, this is accomplished using another suitable method and/or architecture of preprocessor 100.

Finally, the preprocessor can output (430) the adjusted audio signal to a loudspeaker—thereby—in some embodiments—playing the audio on the loudspeaker with reduced loudspeaker-induced harmonic noise (due to attenuation of the fundamental frequencies) but providing such attenuation only when and only to the extent necessitated by lack of audio content in the harmonic bands that would mask such loudspeaker-induced harmonic noise.

It is noted that the teachings of the presently disclosed subject matter are not bound by the flow chart illustrated in FIG. 4, the illustrated operations can occur out of the illustrated order. For example, operations 410 and 420, shown in succession, can be executed substantially concurrently. It is also noted that whilst the flow chart is described with reference to elements of the system of FIG. 1 or 2, this is by no means binding, and the operations can be performed by elements other than those described herein.

Attention is now directed to FIG. 5, which illustrates a flow diagram of an alternative example processor-based method of adjusting an input audio signal to result in reduced loudspeaker-induced harmonic distortion of a fundamental frequency, in accordance with some embodiments of the presently disclosed subject matter.

The method of FIG. 5 is similar to the method of FIG. 3. In the method of FIG. 5 however, preprocessor 110 (for example: attenuation control unit 230) can estimate (535) the amount of loudspeaker-induced harmonic distortion that the loudspeaker will generate. Preprocessor 110 (for example: attenuation control unit 230) can do this based on the measured energy of the fundamental band. Preprocessor 110 (for example: attenuation control unit 230) can, for example, utilize a software module of the loudspeaker to estimated the amount of loudspeaker-induced harmonic noise that will result from the fundamental band.

Preprocessor 110 (for example: attenuation control unit 230) can then calculate (540) a ratio between the measured energy of the harmonic band and the estimated loudspeaker-induced harmonic noise, and dynamically attenuate (550) the fundamental frequency band by an attenuation gain that is derived from this ratio.

It is noted that the teachings of the presently disclosed subject matter are not bound by the flow chart illustrated in FIG. 5, the illustrated operations can occur out of the illustrated order. For example, operations 510 and 520, shown in succession, can be executed substantially concurrently, or in the reverse order. It is also noted that whilst the flow chart is described with reference to elements of the system of FIG. 1 or 2, this is by no means binding, and the operations can be performed by elements other than those described herein.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

Those skilled in the art will readily appreciate that various modifications and changes can be applied to the embodiments of the invention as hereinbefore described without departing from its scope, defined in and by the appended claims.

The invention claimed is:

1. A processor-based method of producing an audio signal of reduced harmonic distortion from a loudspeaker, the method comprising:
   a) detecting, in an input audio band to the loudspeaker, a harmonic frequency band including one or more frequencies that are integer multiples of a first fundamental frequency;
   b) dynamically attenuating a first fundamental frequency band of the input audio signal by an attenuation amount, the first fundamental frequency band including the first fundamental frequency, wherein the attenuation amount is at least partly determined from
   an energy of the harmonic frequency band of the input audio signal,
   thereby producing an adjusted audio signal usable for input to the loudspeaker.

2. The method of claim 1, wherein the attenuation amount is at least partially determined from
   an energy of the first fundamental frequency band of the input audio signal.

3. The method of claim 2, wherein the attenuation amount is at least partially determined from a ratio between
   i) the energy of the harmonic frequency band, and
   ii) the energy of the first fundamental frequency band.

4. The method of claim 3, wherein the attenuation amount is at least partially determined from a power law of the ratio.

5. The method of claim 3, wherein the attenuation amount is set to 0 dB when the ratio between energy of the harmonic frequency band and the energy of the first fundamental frequency band being greater than a relative-energy threshold.

6. The method of claim 1, additionally comprising:
   repeating said detecting and said dynamically attenuating for one or more additional fundamental frequency bands,
   wherein the additional fundamental frequency bands include respective fundamental frequencies, and
   the harmonic frequency bands include respectively frequencies that are integer multiples of the fundamental frequency bands.

7. The method of claim 1, additionally comprising:
   outputting the adjusted audio signal to the loudspeaker.

8. The method of claim 1, wherein the first fundamental frequency band includes a third harmonic frequency of the first fundamental frequency.

9. The method of claim 1, wherein the dynamically attenuating comprises:
   measuring an energy of the first fundamental frequency band and an energy of the harmonic frequency band;
   calculating an attenuation amount, the attenuation amount being derivative of a ratio between the measured energy of the harmonic frequency band and the measured energy of the first fundamental frequency band; and
   attenuating the first fundamental frequency band by the attenuation amount.

10. The method of claim 1, wherein the attenuation amount is at least partially determined from a ratio between i) an energy of the harmonic frequency band in the input audio signal, and ii) an estimated energy of loudspeaker-induced harmonic distortion of the first fundamental frequency in the input audio signal,
    wherein the estimated energy of loudspeaker-induced harmonic distortion is derivative of energy of the first fundamental frequency band in the input audio signal.

11. A system of producing an audio signal of reduced harmonic distortion from a loudspeaker, the system comprising a processing circuitry configured to:
    a) detect, in an input audio band to the loudspeaker, a harmonic frequency band including one or more frequencies that is an integer multiple of a first fundamental frequency;
    b) dynamically attenuate a first fundamental frequency band of the input audio signal by an attenuation amount, the first fundamental frequency band including the first fundamental frequency, wherein the attenuation amount is at least partly determined from
    an energy of the harmonic frequency band of the input audio signal,
    thereby producing an adjusted audio signal usable for input to the loudspeaker.

12. The system of claim 11, wherein the processing circuitry is configured to set the attenuation amount in accordance with, at least,
    an energy of the first fundamental frequency band of the input audio signal.

13. The system of claim 12, wherein the processing circuitry is configured to set the attenuation amount in accordance with, at least, a ratio between:
    i) the energy of the harmonic frequency band, and
    ii) the energy of the first fundamental frequency band.

14. The system of claim 13, wherein the processing circuitry is configured to set the attenuation amount in accordance with, at least, a power law of the ratio.

15. A non-transitory computer readable storage medium containing program instructions, which program instructions when read by a processor, cause the processor to perform a method of producing an audio signal of reduced harmonic distortion from a loudspeaker, the method comprising:
- a) detecting, in an input audio band to the loudspeaker, a harmonic frequency band including one or more frequencies that is an integer multiple of a first fundamental frequency;
- b) dynamically attenuating a first fundamental frequency band of the input audio signal by an attenuation amount, the first fundamental frequency band including the first fundamental frequency, wherein attenuation amount is at least partly determined from
  an energy of the harmonic frequency band of the input audio signal,
  thereby producing an adjusted audio signal usable for input to the loudspeaker.

16. The non-transitory computer-readable storage medium of claim 15, wherein the attenuation amount is at least partially determined from
an energy of the first fundamental frequency band of the input audio signal.

17. The non-transitory computer-readable storage medium of claim 16, wherein the attenuation amount is at least partially determined from a ratio between
- iii) the energy of the harmonic frequency band, and
- iv) the energy of the first fundamental frequency band.

18. The non-transitory computer-readable storage medium of claim 17, wherein the attenuation amount is at least partially determined from a power law of the ratio.

19. The non-transitory computer-readable storage medium of claim 15, the method additionally comprising:
repeating said extracting and said dynamically attenuating for one or more additional fundamental bands,
  wherein the additional fundamental bands includes respective fundamental frequencies, and
  the harmonic bands include respective frequencies that are integer multiples of the fundamental frequency bands.

20. The non-transitory computer-readable storage medium of claim 15, the method additionally comprising:
outputting the adjusted audio signal to the loudspeaker.

* * * * *